(12) United States Patent
Kato et al.

(10) Patent No.: US 6,317,274 B1
(45) Date of Patent: Nov. 13, 2001

(54) OPTICAL ELEMENT

(75) Inventors: Hideo Kato, Utsunomiya; Hiroshi Maehara, Yokohama, both of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/533,691

(22) Filed: Mar. 23, 2000

(30) Foreign Application Priority Data

Mar. 25, 1999 (JP) .................................................. 11-082500

(51) Int. Cl.[7] .............................. G02B 3/08; G02B 13/14; G02B 7/00; G02B 27/44
(52) U.S. Cl. ......................... 359/742; 359/355; 359/509; 359/565; 359/566
(58) Field of Search ................................... 359/742, 667, 359/509, 355, 566, 571, 565

(56) References Cited

U.S. PATENT DOCUMENTS

| | | | |
|---|---|---|---|
| 5,208,700 | * 5/1993 | Harris et al. | 359/558 |
| 5,214,535 | * 5/1993 | Harris et al. | 359/565 |
| 5,602,683 | * 2/1997 | Straaijer et al. | 359/811 |
| 5,696,623 | * 12/1997 | Fujie et al. | 359/350 |
| 6,008,942 | * 12/1999 | Ogusu et al. | 359/571 |
| 6,091,501 | * 7/2000 | Saikanmäki et al. | 356/402 |

* cited by examiner

Primary Examiner—Georgia Epps
Assistant Examiner—David N. Spector
(74) Attorney, Agent, or Firm—Fitzpatrick, Cella, Harper & Scinto

(57) ABSTRACT

An optical element includes a first substrate having a diffractive surface or a surface structure with a surface level difference, a second substrate for covering the diffractive surface or the surface structure to provide a shield therefor, and a groove provided at the diffractive surface or the surface structure, and extending from a central portion to a peripheral portion thereof, for discharging or replacing a gas at the diffractive surface or the surface structure therethrough.

17 Claims, 6 Drawing Sheets

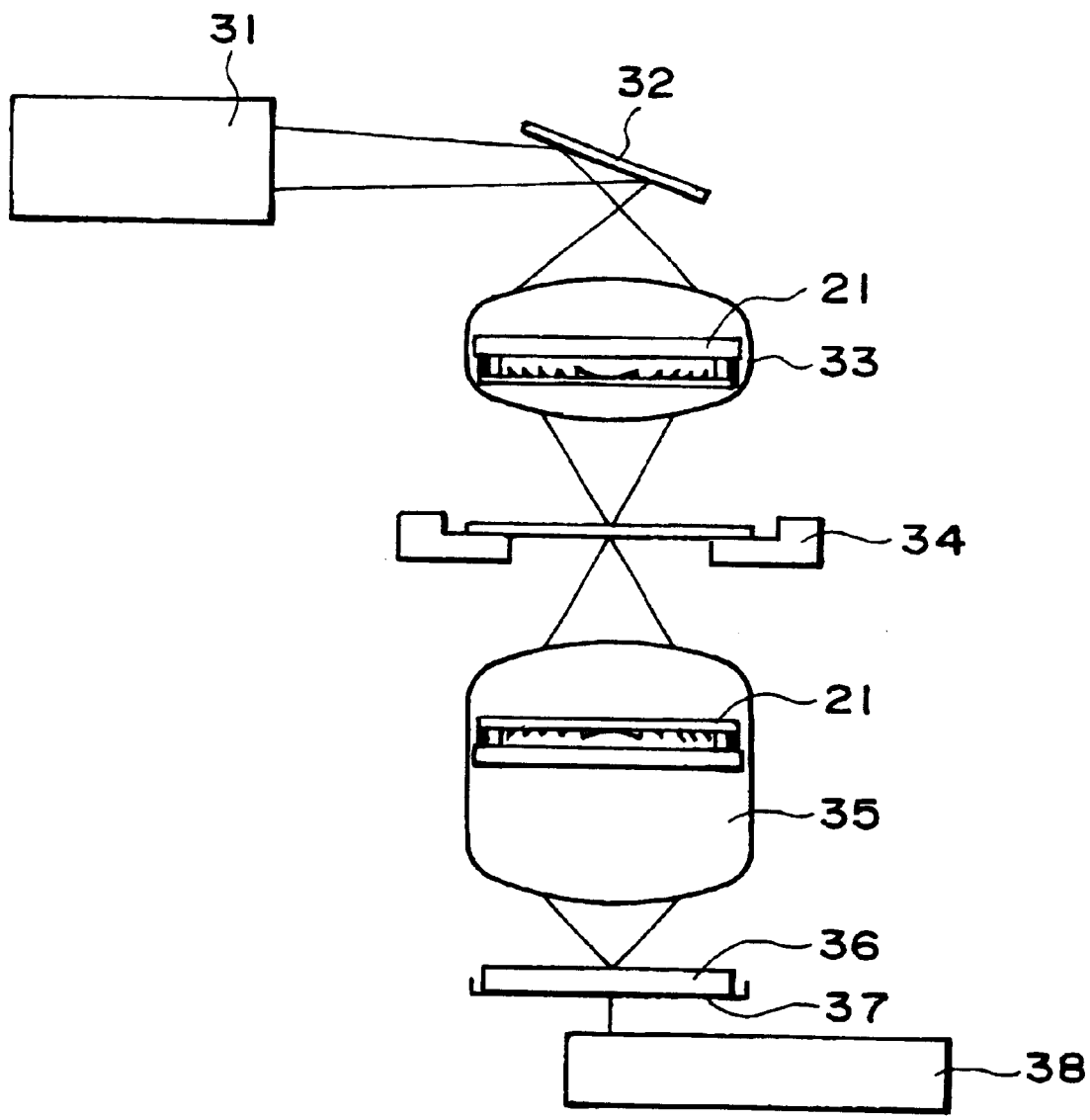
F I G. 7

OPTICAL ELEMENT

FIELD OF THE INVENTION AND RELATED ART

This invention relates to an optical element suitably usable in an exposure apparatus, a photographing apparatus or an illumination system, for example.

Diffraction gratings are used as a spectral element in spectroscopes. A diffraction grating as such a spectral element is formed with a saw-toothed shape, called a blazed shape, and it has a very high diffraction efficiency of up to 100%.

Recently, diffractive optical elements, particularly, binary optics (BO) elements with a diffraction grating of step-like shape have attracted much attention, because of its achromatic effect and aspherical effect.

Since a binary optic element has a surface formed by microprocessing, it should be handled very carefully. On the other hand, in projection exposure apparatuses into which a binary optic element can be incorporated, contamination of an optical system becomes a critical problem. That is, when high energy light such as KrF laser ($\lambda$=248 nm), ArF laser ($\lambda$=194 nm) or $F_2$ laser ($\lambda$=157 nm) is used as exposure light, due to an influence such as a surrounding ambience, for example, contaminating materials may be deposed on the surface of a binary optics. Further, conventional clean rooms are designed in regard to dust or particles only. Therefore, any decomposed matters or vaporized matters may contaminate the surface of a binary optics.

SUMMARY OF THE INVENTION

It is an object of the present invention to provide an optical element by which contamination of the surface thereof can be reduced or avoided.

In accordance with an aspect of the present invention, there is provided an optical element, including a first substrate having a diffractive surface; a second substrate for covering the diffractive surface to provide a shield therefor; and groove means provided at the diffractive surface and extending from a central portion to a peripheral portion thereof, for discharging or replacing a gas at the diffractive surface therethrough.

In one preferred form of this aspect of the present invention, the diffractive surface has a ring-like pattern, and the groove means extends radially from a central portion of the ring-like pattern.

The second substrate may comprise a light transmissive member adhered to the first substrate to define a tightly closed space therebetween.

The light transmissive member may be fixed by adhesion at a top surface of the optical element.

The light transmissive member may be made of a glass material having a transmissivity to deep ultraviolet rays.

The closed space may comprise one of a space replaced by an inactive gas, a reduced pressure space and a vacuum space.

Each of the first and second substrates may have an anti-reflection film.

In accordance with another aspect of the present invention, there is provided an optical element including a first substrate having a surface structure with a surface level difference; a second substrate for covering the surface structure to provide a shield therefor; and groove means provided at the surface structure and extending from a central portion to a peripheral portion thereof, for discharging or replacing a gas at the surface structure therethrough.

In one preferred form of this aspect of the present invention, the surface structure has a ring-like pattern, and the groove means extends radially from a central portion of the ring-like pattern.

The second substrate may comprise a light transmissive member adhered to the first substrate to define a tightly closed space therebetween.

The light transmissive member may be fixed by adhesion at a top surface of the optical element.

The light transmissive member may be made of a glass material having a transmissivity to deep ultraviolet rays.

The closed space may comprise one of a space replaced by an inactive gas, a reduced pressure space and a vacuum space.

Each of the first and second substrates may have an anti-reflection film.

In accordance with a further aspect of the present invention, there is provided an optical system including an optical element as recited above.

In accordance with a still further aspect of the present invention, there is provided an exposure apparatus including an optical system as recited above.

In accordance with a yet further aspect of the present invention, there is provided a device manufacturing method including an exposure process for exposing a wafer by use of an exposure apparatus as recited above, and a development process for developing the exposed wafer.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 7 is a schematic view of a main portion of a stepper.

DESCRIPTION OF THE PREFERRED EMBODIMENTS

Preferred embodiments of the present invention will now be described with reference to the accompanying drawings.

Figure 1:
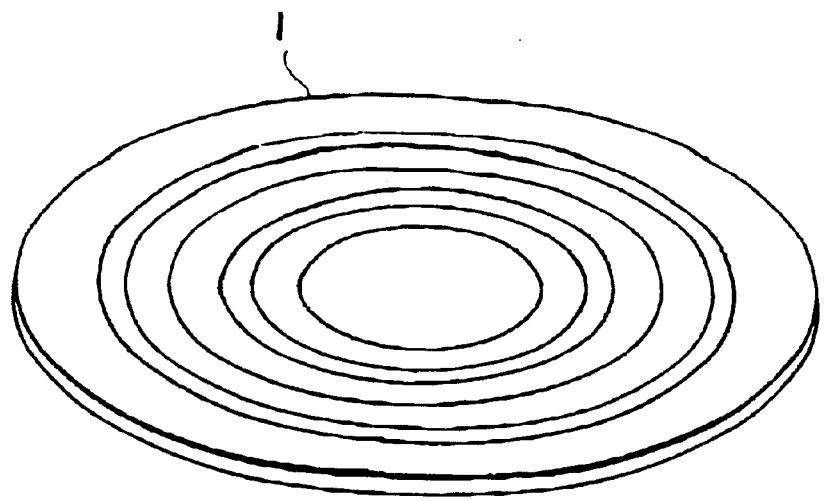
FIG. 1 is a schematic and perspective view of a binary optics lens.
Figure 2:
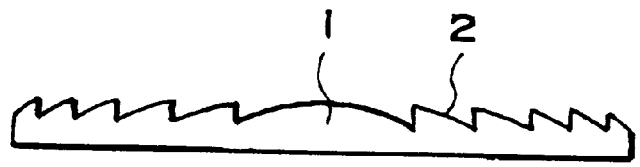
FIG. 2 is a schematic and sectional view of a binary optics lens.

FIG. 1 is a perspective view of a binary optics or a diffraction grating (lens) according to a first embodiment of the present invention. FIG. 2 is a sectional view of this element. The binary optics element in this embodiment is designed for use in diffraction of KrF excimer laser light having a useful wavelength of 248 nm. There are rings 2 of a number of about 18,000 formed on a transparent substrate. Each ring has a step-like shape (binary shape) of eight levels. This shape is based on approximation of an idealistic shape, called Kinoform.

Figure 3:
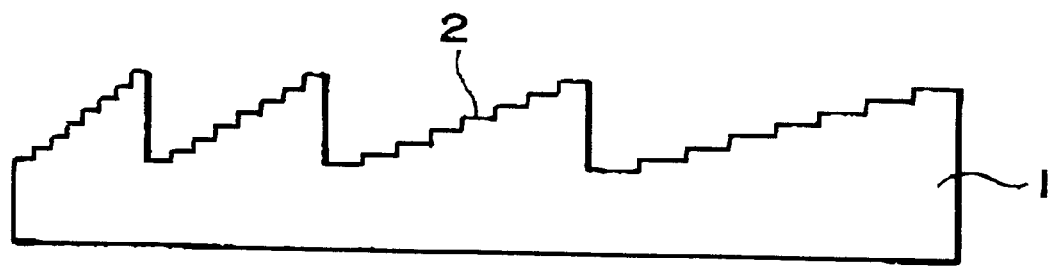
FIG. 3 is a schematic and sectional view of a step-like binary optics element

FIG. 3 is a schematic view of a unit (structure of one ring) of the binary optics having an eight-level stepped shape. The outermost ring 2 of the element 1 has a width 2.8 microns and a height 0.434 micron. Each step of the step-like structure has a width 0.35 micron and a height 0.062 micron.

Figure 4:
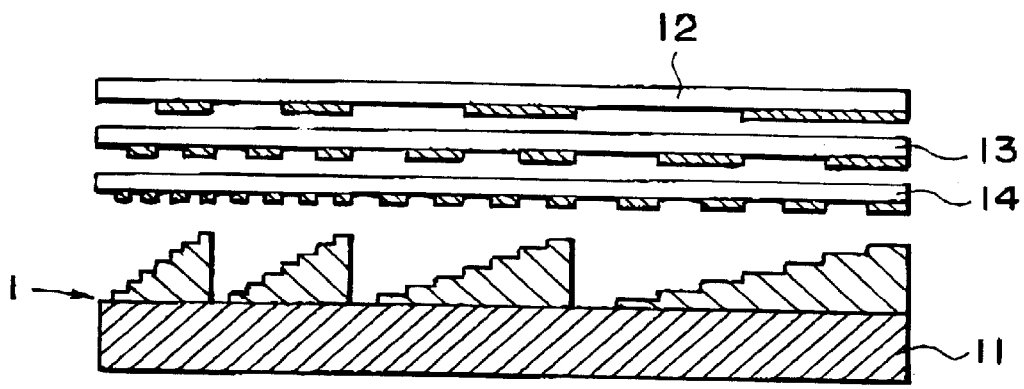
FIG. 4 is a schematic and sectional view of a binary optics lens and a mask.

FIG. 4 is a sectional view of binary optics and a mask, in manufacture of the binary optics element shown in FIGS. 1–3. A substrate 11 comprises a quartz substrate of a diameter of 220 mm and a thickness of 2 mm. Chromium masks 12, 13 and 14 are disposed, above the substrate 11, sequentially to repeatedly perform an exposure process, a development process and an etching process.

An i-line stepper having a wavelength $\lambda$=365 nm may be used for manufacture of the binary optics element 1. In relation to each of masks 12–14, a pattern thereof is printed on a photoresist upon the substrate 11 in a reduced scale, and then a development process is performed thereto. A resist pattern thus developed is used in cooperation with a parallel plane plate type dry etching (RIE) apparatus, to etch the surface of the substrate 11.

Figure 5:
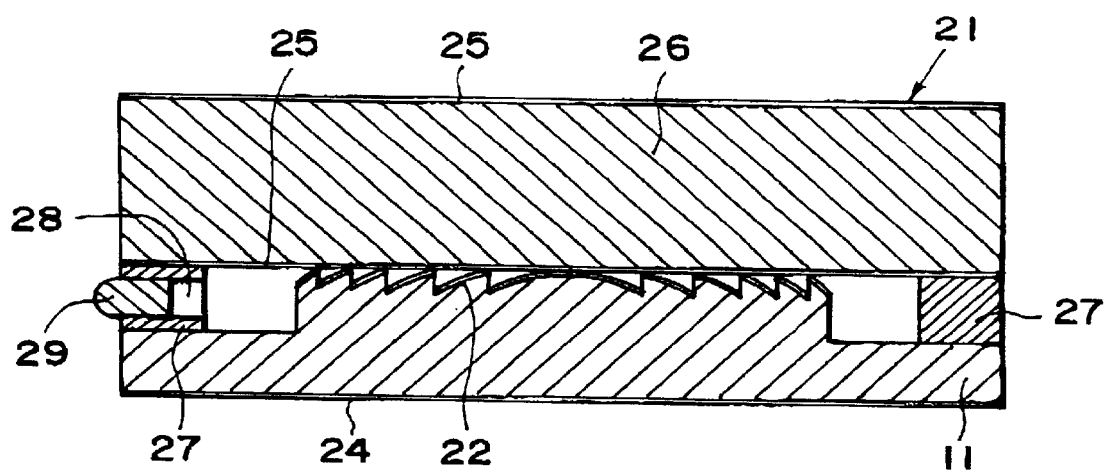
FIG. 5 is a schematic and sectional view of a binary optics element.
Figure 6:
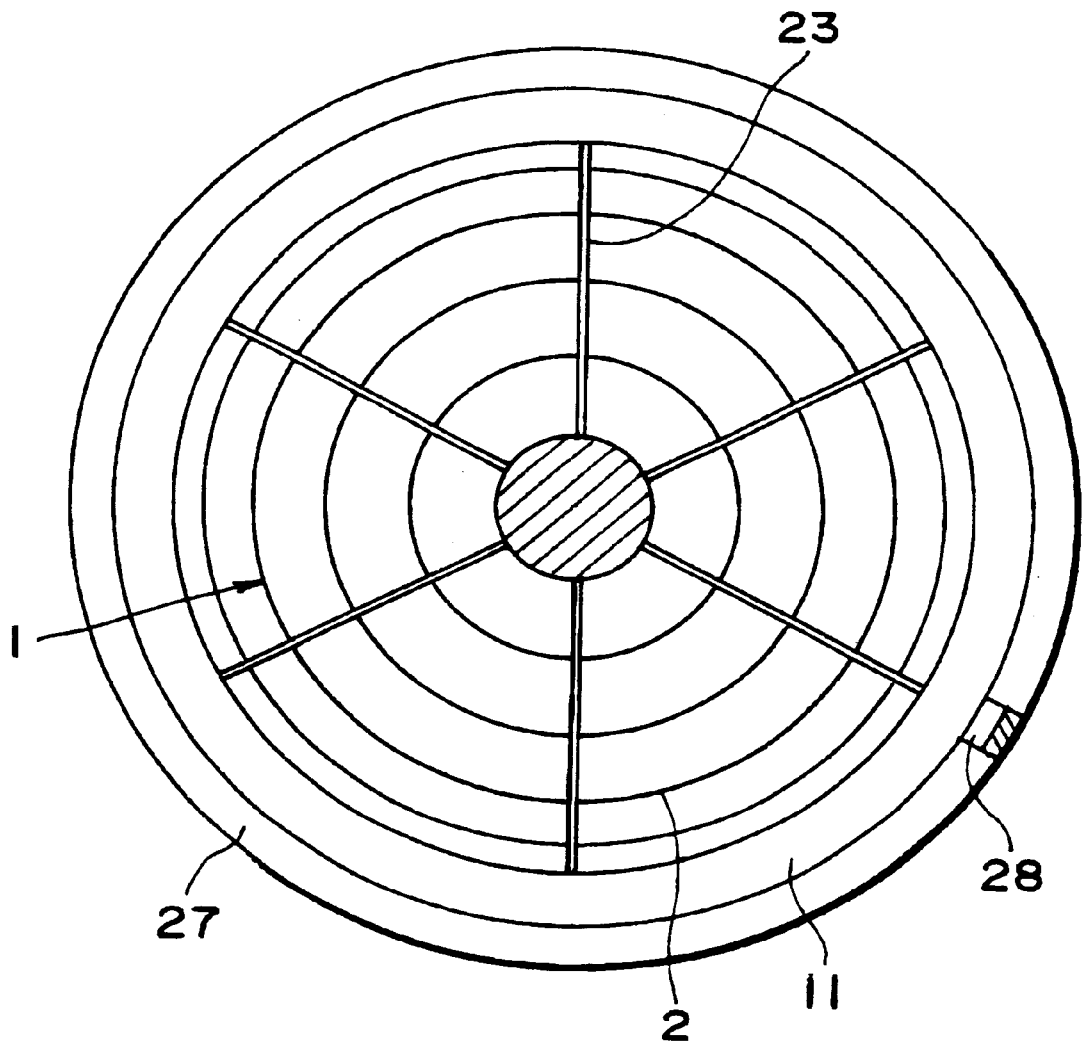
FIG. 6 is a schematic and plan view of a binary optics lens.

In this embodiment, three masks 12–14 are used and the above-described procedure is repeated three times, by which a binary optics of eight levels can be produced FIG. 5 is a sectional view of a shield type binary optics element 21 according to an embodiment of the present invention, wherein the section contains an optical axis. FIG. 6 is a plan view of a binary optics 1 of the binary optics element 21, wherein the plane is orthogonal to the optical axis.

On the surface of the binary optics element 1, there is an anti-reflection film 22 comprising a magnesium fluoride ($MgF_2$) film of a thickness of about 43 nm, formed by use of a resistance heating type vapor deposition apparatus. Further, there are plural (e.g., six) straight grooves 23 formed on the surface of the binary optics 1. extending from a central portion to a peripheral portion thereof. Each groove has a width of 0.1 mm and a depth of about 0.5 micron which is similar to the level difference of the binary optics element 21 having rings 2. The ring 2 at the central portion has a diameter of about 1 mm, from which the six grooves 23 extend radially and equiangularly with an angle 60 deg. On the bottom surface of the binary optics substrate 11, there is an anti-reflection film 24 made of magnesium fluoride. The binary optics 1 (diffraction grating) of the binary optics element 21 can be produced in a similar manner as described hereinbefore with reference to FIGS. 1–4.

There is a shielding transparent substrate 26 disposed on the binary optics element 1. this substrate 26 has a diameter of 220 mm and a thickness of 30 mm. The opposite surfaces of the substrate 26 are covered by anti-reflection films 25 made of magnesium fluoride. Disposed between the substrate 11 and the substrate 26 is a ring-like sealing member 27 made of a glass series material such as $BeO_2$ or PbO, for example. By using this sealing member 27 and under a temperature of about 500 °C., the outside peripheral portions of the substrates 11 and 26, of a width 10 mm, are bonded to each other. The sealing member 27 is formed with an opening 28 for vacuum or gas replacement to a tightly closed space defined between the substrates.

Then, the binary optics element 21 may be placed in a vacuum chamber and, through the opening 28, degassing may be carried out. In this process, since the binary optics element 21 is provided with grooves 23, the central portion of the binary optics 1 intimately contacted to the shielding substrate 26 can also be degassed. In this manner, the inside of the binary optics element 21 can be completely degassed. Subsequently, in a vacuum ambience, the opening 28 may be sealed by heating, by use of a metal series sealing material 29.

In accordance with the sequential procedure described above, a shield type binary optics element (21) of a diameter 220 mm and a thickness 32 mm can be produced. The thus produced binary optics element 21 has a high diffraction efficiency of 85% in average.

In the binary optics element 21 produced in accordance with this embodiment, the binary optics 1 (relief type diffraction grating) is protected by the shielding substrate 26. Therefore, handling is easy and it can be washed when finished. The possibility of contamination is very small. Conventionally, when a binary optics is used for about six months, contamination matters are deposited on the binary optics, and the transmission factor or diffraction efficiency thereof is degraded. A binary optics element (21) manufactured in accordance with this embodiment will be substantially free from such change, and a good result will be attainable constantly.

As an alternative, while a top face and a bottom face of a binary optics 1 as well as the opposite faces of a shielding substrate 26 are coated with anti-reflection films like the first embodiment, plural (e.g., eight) grooves of a width of about 0.2 mm may be formed on the top face of the binary optics 1, from the central portion to the peripheral portion thereof. Each anti-reflection film may comprise a double-layer film being made of magnesium fluoride of a film thickness of about 43 nm and aluminum of a film thickness of about 36 nm.

As a further alternative, like the first embodiment, the outside peripheral portions of the substrates 11 and 26 may be bonded to each other by use of a photo-setting type adhesive agent. If such photo-setting adhesive agent is used, the bonding can be done at an ordinary temperature with irradiation of ultraviolet rays. Thus, the handling is much easier. In such procedure, like the first embodiment, an opening of a width 2 mm may be provided and the inside of the element may be sufficiently degassed in a vacuum chamber. Subsequently, the vacuum chamber may be filled with a helium gas such that the tightly closed inside space of the element may be replaced by a helium gas. The opening may then be sealed.

According to measurements, shield type binary optics elements (21) produced in accordance with the procedure described above have a good average diffraction efficiency of 88%.

The inside closed space ot a binary optic element (21) may be filled with an inert gas, containing no dust. chemical matter or humidity (cause of contamination). It may be placed in a reduced pressure of such inert gas or in vacuum state.

The shielding substrate 26 made of quartz may be replaced by a shielding substrate made ot fluorite crystal material. Sapphire or the like may be used as a shielding substrate which is transmissive to deep ultraviolet rays. The pattern portion of the diffraction grating of the binary optics may be produced by performing a photolithography process and a dry etching process, like the first embodiment, to a $SiO_2$ film formed on a substrate 11 made. of fluorite.

The binary optics may be formed with radial grooves of a number 32, each having a width of about 20 microns. Like the first embodiment, shielding substrates 11 and 26 may be bonded and, after degassing, a nitrogen gas may be introduced into the tightly closed inside space. After the inside of the binary optics element (21) is sufficiently replaced by the nitrogen gas, the opening may be sealed by a sealing material. A binary optics element produced in accordance with this procedure provides good results as in the first embodiment.

The present invention is not limited to a binary optics, that is an element with a diffraction grating. The invention is applicable also to an element having a surface structure with a surface level difference (e.g. protrusion or recess).

A binary optics element (21) produced in the manner described above can be incorporated into various optical systems. For example, an optical system including such binary optics element (21) is used in a semiconductor device manufacturing reduction projection exposure apparatus (stepper) for use with a KrF excimer laser, for example. Through a photolithographic process wherein a circuit pattern is projected printed on a photoresist upon a wafer in a reduced scale and through subsequent sequential processes for semiconductor manufacture, high performance semiconductor devices such as integrated circuits can be produced stably.

FIG. 7 is a schematic view of a stepper using a KrF excimer laser ($\lambda$=248 nm). The laser light emitted from a KrF excimer laser (output device) 31 is reflected by a reflection mirror 32, and it is introduced into an illumination optical system 33 having a binary optics element 21 as a lens. With this illumination optical system 33, the light is transformed into light having a uniform illuminance distribution. Then, the light illuminates a reticle 34. The pattern light which bears information regarding a pattern of the reticle, produced in response to illumination of the reticle 34, is reduced by a projection optical system 35 at a ratio of 1:4. The projection optical system 35 has a binary optics element 21 as a lens. The pattern light is projected by the projection optical system onto a resist coating 37 on a silicon wafer 36. The pattern projection and exposure operation described above are repeated while moving a stage 38 in step-and-repeat method, such that patterns are printed on shot areas on the wafer sequentially.

Thus, as described, semiconductor devices can be produced by use of a KrF excimer laser stepper having one or more binary optics elements 21.

Figure 8:
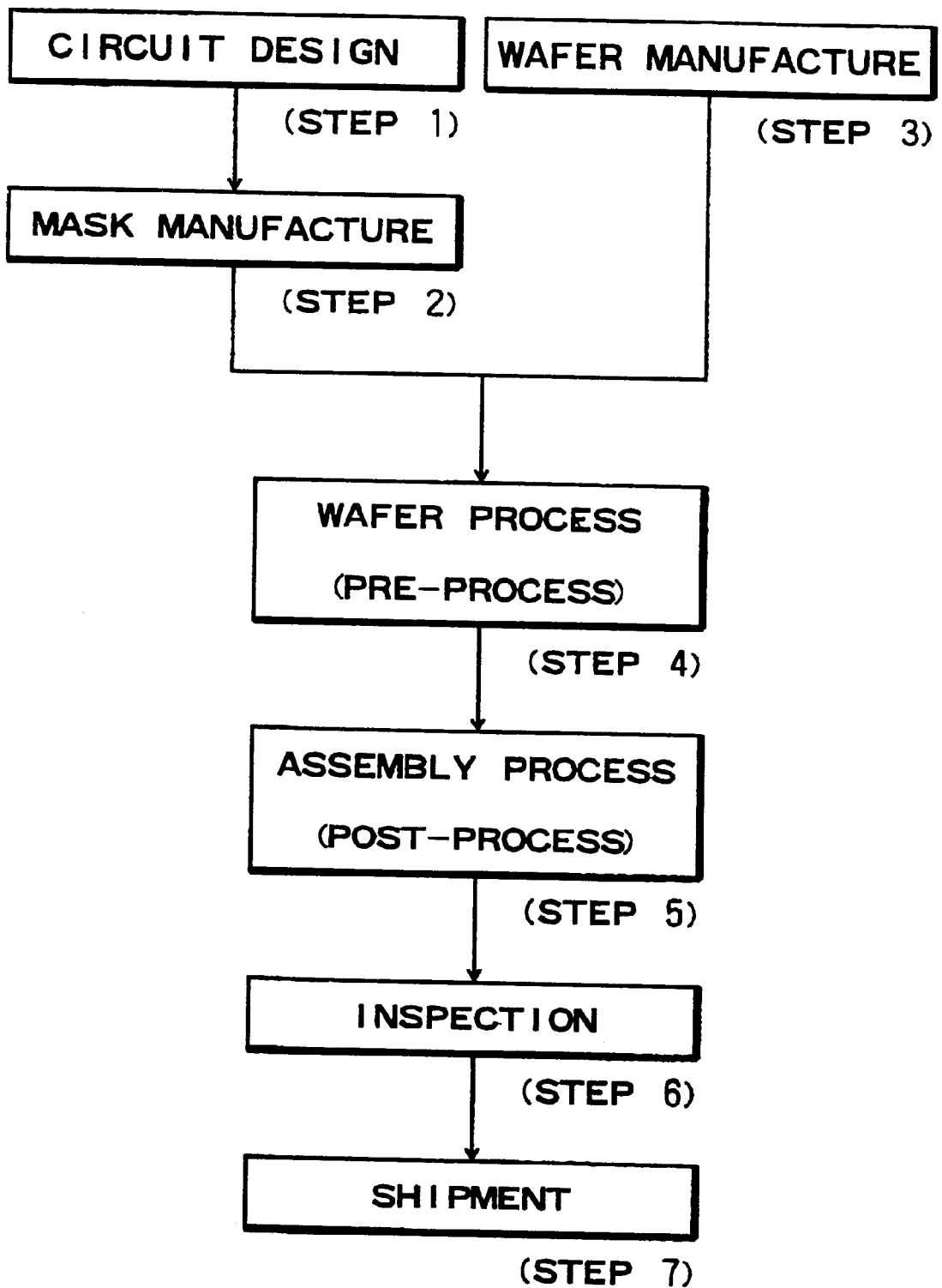
FIG. 8 is a flow chart of semiconductor device manufacturing processes.

FIG. 8 is a flow chart of procedure for manufacture of semiconductor devices such as semiconductor chips (e.g. ICs or LSIs), liquid crystal panels, or CCDs, for example.

Step 1 is a design process for designing a circuit of a semiconductor device. Step 2 is a process for making a mask (reticle) on the basis of the circuit pattern design, wherein a chromium mask plate may be patterned by use of an electron beam patterning apparatus. Step 3 is a process for preparing a wafer by using a material such as silicon. Step 4 is a wafer process (called a pre-process) wherein, by using the so prepared mask and wafer, circuits are practically formed on the wafer through lithography. Step 5 is an assembling step (called a post-process) wherein the wafer having been processed by step 4 is formed into semiconductor chips. This step includes an assembling (dicing and bonding) process and a packaging (chip sealing) process. Step 6 is an inspection step wherein operation check, durability check and so on for the semiconductor devices provided by step 5, are carried out. With these processes, semiconductor devices are completed and they are shipped (step 7).

Figure 9:
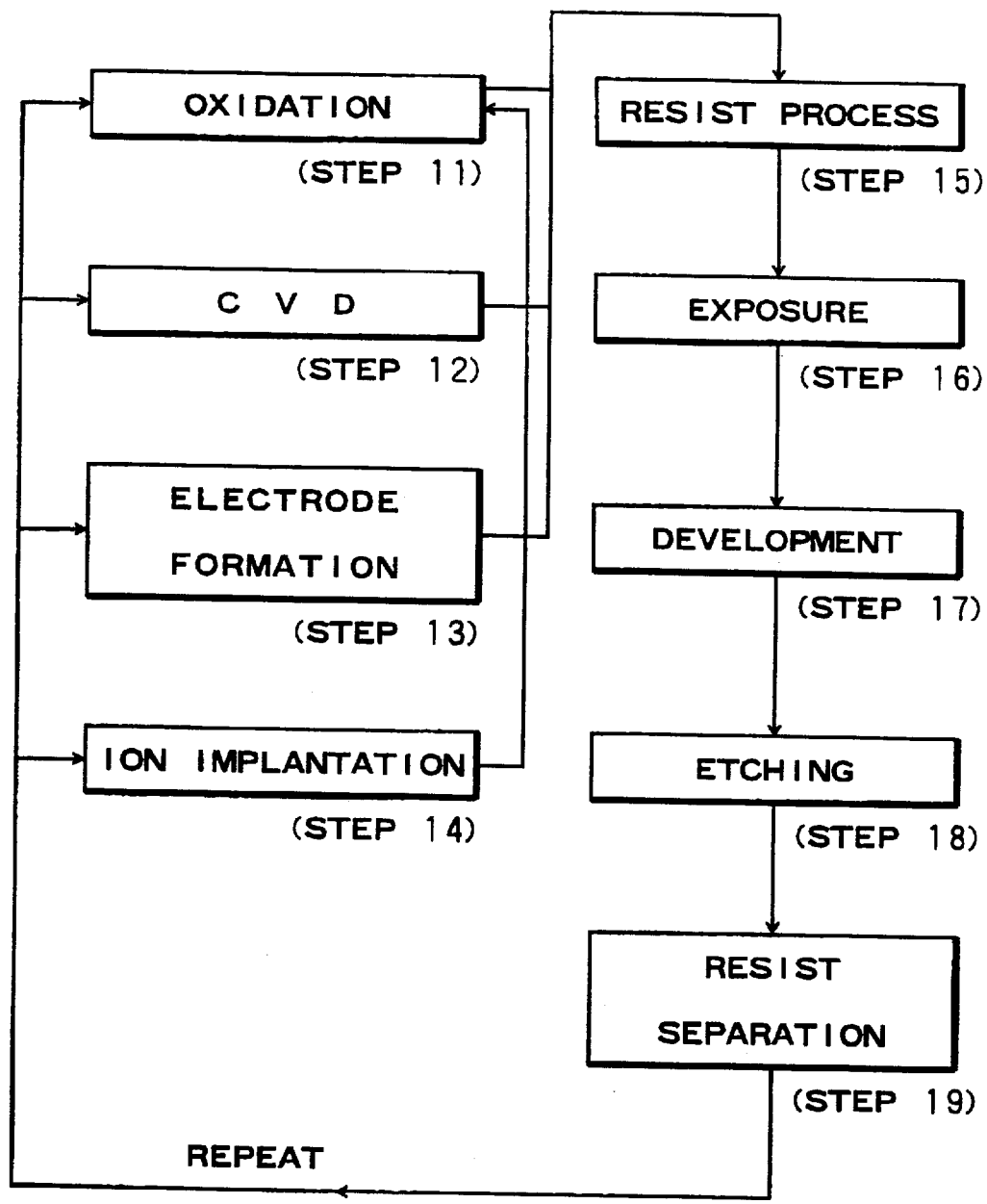
FIG. 9 is a flow chart for explaining details of a wafer process in the procedure of the flow chart of FIG. 8.

FIG. 9 is a flow chart showing details of the wafer process, step 3 in FIG. 8.

Step 11 is an oxidation process for oxidizing the surface ot a wafer Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a chemical amplification type resist (photosensitive material) to the wafer Step 16 is an exposure process for printing, by exposure, the circuit pattern of the mask on the wafer through a KrF excimer laser stepper (FIG. 8) in accordance with the step-and-repeat method. Step 17 is a developing process for developing the resist of the exposed wafer. This process may include a PEB (post exposure baking) process peculiar to a chemical amplification type resist, beforehand. Step IS is an etching process for removing portions other than the developed resist image Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An optical element, comprising:

a first substrate having a diffractive surface;

a second substrate for covering the diffractive surface to provide a shield therefor; and groove means provided at the diffractive surface and extending from a central portion to a peripheral portion thereof, for discharging or replacing a gas at the diffractive surface therethrough.

2. An optical element according to claim 1, wherein the diffractive surface has a ring-like pattern, and wherein said groove means extends radially from a central portion of the ring-like pattern.

3. An optical element according to claim 1, wherein said second substrate comprises a light transmissive member adhered to said first substrate to define a tightly closed space therebetween.

4. An optical element according to claim 3, wherein the light transmissive member is fixed by adhesion at a top surface of said optical element.

5. An optical element according to claim 3, wherein the light transmissive member is made of a glass material having a transmissivity to deep ultraviolet rays.

6. An optical element according to claim 3, wherein the closed space comprises one of a space replaced by an inactive gas, a reduced pressure space and a vacuum space.

7. An optical element according to claim 3, wherein each of said first and second substrate has an anti-reflection film.

8. An optical element, comprising:

a first substrate having a surface structure with a surface level difference;

a second substrate for covering the surface structure to provide a shield therefor; and groove means provided at the surface structure and extending from a central portion to a peripheral portion thereof, for discharging or, replacing a gas at the surface structure therethrough.

9. An optical element according to claim 8, wherein the surface structure has a ring-like pattern, and wherein said groove means extends radially from a central portion of the ring-like pattern.

10. An optical element according to claim 8, wherein said second substrate comprises a light transmissive member adhered to said first substrate to define a tightly closed space therebetween.

11. An optical element according to claim 10, wherein the light transmissive member is fixed by adhesion at a top surface of said optical element.

12. An optical element according to claim 10, wherein the light transmissive member is made of a glass material having a transmissivity to deep ultraviolet rays.

13. An optical element according to claim 10, wherein the closed space comprises one of a space replaced by an inactive gas, a reduced pressure spare and a vacuum space.

14. An optical element according to claim 10, wherein each of said first and second substrate has an anti-reflection film.

15. An optical system including an optical element as recited in any one of claims 1–14.

16. An exposure apparatus including an optical system as recited in claim 15.

17. A device manufacturing method including an exposure process for exposing a wafer by use of an exposure apparatus as recited in claim 16, and a development process for developing the exposed wafer.

* * * * *

UNITED STATES PATENT AND TRADEMARK OFFICE
CERTIFICATE OF CORRECTION

PATENT NO. : 6,317,274 B1  Page 1 of 1
DATED : November 13, 2001
INVENTOR(S) : Hideo Kato et al.

It is certified that error appears in the above-identified patent and that said Letters Patent is hereby corrected as shown below:

Column 3,
Line 53, "this" should read -- This --.

Column 4,
Line 53, "ot" should read -- of --;
Line 54, "dust." should read -- dust, --;
Line 59, "ot" should read -- of --; and
Line 65, "made." should read -- made --.

Column 5,
Line 12 and 47, "(e.g." should read -- (e.g., -- and

Column 6,
Line 2, "ot a wafer" should read -- of a wafer. --;
Line 8, "wafer" should read -- wafer. --;
Line 15, "Step IS" should read -- Step 18 --;
Line 16, "image" should read -- image. --; and
Line 61, "substrate" should read -- substrates --.

Column 7,
Line 3, "or," should read -- or --.

Column 8,
Line 5, "substrate" should read -- substrates --.

Signed and Sealed this

Thirtieth Day of July, 2002

*Attest:*

JAMES E. ROGAN
*Attesting Officer*  *Director of the United States Patent and Trademark Office*